United States Patent
Denning et al.

(10) Patent No.: US 6,451,181 B1
(45) Date of Patent: Sep. 17, 2002

(54) METHOD OF FORMING A SEMICONDUCTOR DEVICE BARRIER LAYER

(75) Inventors: Dean J. Denning, Del Valle; Sam S. Garcia, Austin; Bradley P. Smith, Austin; Daniel J. Loop, Austin; Gregory Norman Hamilton, Pflugerville; Md. Rabiul Islam; Brian G. Anthony, both of Austin, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/261,879

(22) Filed: Mar. 2, 1999

(51) Int. Cl.$^7$ .............................................. C23C 14/34
(52) U.S. Cl. ........................ 204/192.17; 204/192.15; 204/192.12; 204/192.3; 204/298.06; 438/582; 438/652; 438/653; 438/656; 438/685; 438/698
(58) Field of Search ..................... 204/192.12, 192.15, 204/192.17, 192.3, 298.08, 298.06; 438/582, 698, 652, 653, 656, 685

(56) References Cited

U.S. PATENT DOCUMENTS

| | | | |
|---|---|---|---|
| 4,999,096 A | * 3/1991 | Nihei et al. | 204/192.3 |
| 5,175,608 A | 12/1992 | Nihei et al. | |
| 5,707,498 A | * 1/1998 | Ngan | 204/192.12 |
| 6,080,285 A | * 6/2000 | Liu et al. | 204/192.12 |
| 6,139,699 A | * 10/2000 | Chiang et al. | 204/192.15 |

FOREIGN PATENT DOCUMENTS

| | | |
|---|---|---|
| EP | 0818558 | 1/1998 |
| EP | 0845545 | 6/1998 |
| FR | 2436625 | 4/1980 |
| JP | 59208071 | 11/1984 |
| JP | 63303064 | 12/1988 |
| JP | 10321558 | 12/1998 |
| WO | WO98/54377 | 12/1998 |

OTHER PUBLICATIONS

EPO 00104085 Search Report, 2 pgs.

* cited by examiner

Primary Examiner—Rodney G. McDonald
(74) Attorney, Agent, or Firm—Robert A. Rodriguez; Keith E. Witek

(57) ABSTRACT

A method for forming an improved copper inlaid interconnect (FIG. 11) begins by performing an RF preclean operation (408) on the inlaid structure in a chamber (10). The RF preclean rounds corners (210a and 206a) of the structure to reduce voiding and improve step coverage while not significantly removing copper atoms from the underlying exposed copper interconnects surfaces (202a). A tantalum barrier (220) is then deposited where one portion of the tantalum barrier is more tensile than another portion of the tantalum barrier. After formation of the barrier layer (220), a copper seed layer (222) is formed over a top of the barrier layer. The copper layer is formed while clamping the wafer with an improved clamp (85) which reduces copper peeling and contamination at wafer edges. Copper electroplating and chemical mechanical polishing (CMP) processes are then used to complete the copper interconnect structure.

6 Claims, 6 Drawing Sheets

| RF PRECLEAN CONDITIONS | | |
|---|---|---|
| | PRIOR ART PRECLEAN | STEP 408 PRECLEAN |
| COIL POWER | 200W | ≥300W |
| WAFER POWER | 200W | ≤100W |
| WAFER VOLTAGE | 250V | 50V |

METHOD OF FORMING A SEMICONDUCTOR DEVICE BARRIER LAYER

FIELD OF THE INVENTION

The present invention relates generally to semiconductor manufacturing, and more particularly to barrier/seed deposition processes for copper interconnects.

BACKGROUND OF THE INVENTION

In the integrated circuit (IC) industry, copper is currently being developed as a replacement material for aluminum in interconnects. Copper interconnects are generally improved over aluminum interconnects because the manufacturing of copper is less expensive. In addition, copper interconnects are less resistive than aluminum interconnects and, therefore, generate less heat. Also, the reduced resistance of copper improves the ability of the IC to operate at higher operational frequencies, whereby performance is improved. In addition, copper also has improved electromigration resistance as compared to aluminum.

However, in spite of these advantages, copper has a number of disadvantages which must be overcome if it is to become a viable alternative. One disadvantage of copper includes its potential as a source of mobile ion contamination. Copper ions readily diffuse through conventional dielectric materials used in fabricating semiconductors. If not properly contained, copper can diffuse into active areas of the device and thereby impact device reliability. In addition, copper is not easily etched. It therefore requires that interconnects be formed as inlaid structures, which are more complicated and which require using chemical mechanical polishing (CMP) processes. Further, copper processing requires using new materials and new processes which, if not properly integrated into the manufacturing process, can present a variety of problems and complications.

For example, barrier layers are typically required when using copper interconnects. The barrier layer is formed around the copper to contain it, thereby preventing it from contaminating adjacent layers and active regions. These barrier layers, which are generally not required for aluminum, are creating new manufacturing and integration issues which must be addressed. The materials and processes used to form these barriers are currently not well understood. Therefore, further improvements in these materials and the processes for forming them have the potential to significantly enhance wafer yield, device reliability, and equipment uptime.

Many of the materials (e.g., refractory metals) used for barriers in copper processing also have an ability to negatively impact device reliability. These reliability issues stem, in part, from the stress of the barrier layer relative to adjacent films. Therefore, barrier stress control also has the potential to improve the overall IC yield and reliability.

Furthermore, processes and chambers currently used to deposit copper in the interconnects are not optimized in terms of thickness and uniformity control. The lack of control is problematic. If uniformity of the deposited copper film varies enough, yield can be adversely affected and/or subsequent processes may be further complicated by requiring that adjustments be made to compensate for the non-uniformly deposited film.

Additionally, the lack of adhesion of copper and copper barrier materials to chamber components can present problems during deposition as well as during wafer transport. These materials are a potential particle source. Optimizing the deposition process to improve adhesion of these materials would be advantageous to improving yield and reducing particulate contamination in processing chambers.

Many copper processes have step coverage problems wherein the via and trench sidewalls are covered to a lesser extent by the copper film than are planer surfaces. In addition, copper voiding problems can also result if the deposited film at the upper portions of the openings is deposited at too high of a rate. This can cause the film to be pinched off, at the top, before completely filling the opening and result in voids being formed within the opening. A process which improves step coverage and minimizes voiding has the potential to enhance yield and reliability for devices having copper interconnects.

Further, back-sputtering of material during pre-metal deposition processes, which is not necessarily a problem with aluminum, is a concern with copper because of the mobile ion concerns cited previously. If aluminum is back-sputtered onto exposed wafer surfaces, chemicals and processes exist to remove it. In addition, this aluminum does not readily diffuse through the various layers. Contrarily, back-sputtered copper is not easily removed, either chemically or otherwise. Unless it is contained with a barrier, it will likely diffuse through adjacent films and impact yield and reliability. Therefore, any interconnect processes which expose underlying copper layers should be engineered to ensure minimal removal of copper from the exposed regions.

Therefore, a need exists in the industry for improved metallization processing whereby copper interconnects can be manufactured in high volumes, with reduced cost, and improved yield and reliability.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

Figure 1:
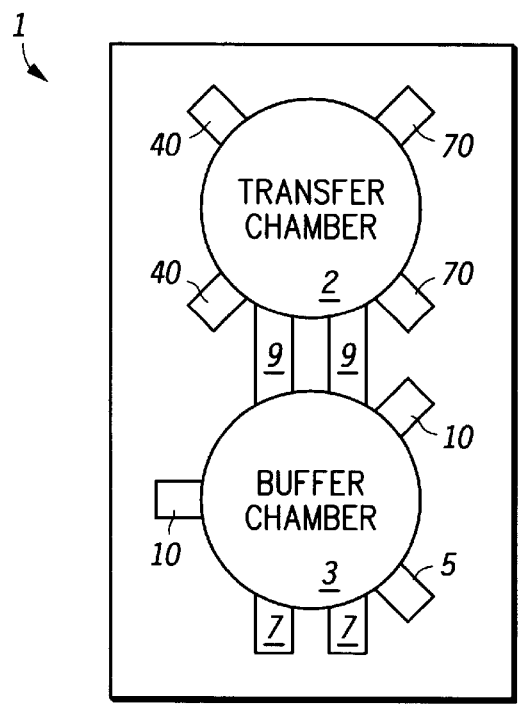
FIG. 1 illustrates, in a top-perspective view, a multichamber integrated circuit deposition system in accordance with the present specification.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE PREFERRED EMBODIMENT

In general, FIGS. 1–14 herein teach an improved method for forming a copper inlaid interconnect structure. Generally, the method teaches improved pre-metal deposition processing of an inlaid or dual inlaid structure, improved deposition processing of a copper barrier within the inlaid structure, and improved deposition processing of a seed layer over the barrier layer.

Specifically, in prior art barrier deposition chambers, electrically biased components are commonly placed in close proximity to other electrically conductive components. In some cases, they unintentionally short circuit and cause the applied bias to change, resulting in inconsistent processing. To prevent this from occurring between an electrically biased wafer pedestal (support member) and other conductive chamber portions, a dielectric or ceramic isolating ring is placed between the pedestal and other conductive chamber components. In addition to protecting the wafer from arcs and short circuits, the isolation ring also helps to insure that the applied bias is directed to the wafer, and not to other conductive portions of the chamber in close proximity to the wafer. Thereby further insuring that the wafer is correctly processed efficiently and with consistent results.

When using tantalum (Ta) to form the barrier, it was found that it did not adhere well to the ceramic isolation ring. This resulted in tantalum particles flaking off of the ceramic isolation ring and onto the wafer. These particles significantly impacted integrated circuit yield. To reduce the level of particles, a design was incorporated which flame sprayed or arc sprayed an aluminum coating over the ceramic isolation ring. The aluminum coating was found to improve adhesion of the tantalum to the isolation ring and significantly reduce the number of particles.

In addition, conventional clamps, used to secure wafers during copper seed layer deposition, were found to be inadequate in the art. The elevated shadow region of the clamp was designed to be too high above the surface of the wafer, whereby copper could deposit on the wafer, in significant quantities, under the shadow region. This produced copper nodules and/or also resulted in areas on the wafer where the thickness of copper decreased in a graded fashion as it extended toward the periphery of the wafer (graded copper regions). During subsequent plating and/or chemical mechanical polishing (CMP) operations, these copper nodules and graded copper regions were found to be a source of particles and reduced die yield because of their propensity to delaminate from the surface of the wafer. Additionally, if the clamp is allowed to contact the wafer in areas that are sputtered with copper, the sputtered copper can adhere to both the clamp surface and the wafer surface, whereupon this sputtered copper can be torn or ripped when the clamp and the wafer are separated from each other. To avoid these problems, an improved clamp has been developed and is described herein that noticeably improves yield by preventing the above adverse phenomena.

In addition, it was found that applying a tantalum nitride (TaN) coating over the barrier deposition chamber's components, after chamber maintenance, greatly reduced chamber down time due to particulates. When the chamber was not coated with TaN, residual tantalum sputtered on the chamber's internal components readily flaked and created particles in the chamber and on the wafer. This resulted in a need to increase the frequency of chamber cleans and a corresponding increase in equipment downtime. It was discovered that a periodic TaN chamber coat/seasoning improved adhesion of the tantalum to internal chamber components and reduced particles, thereby reducing chamber down time and improving semiconductor device die yield.

In prior art processing, via etch and pre-metal deposition processes were typically not optimized to ensure reduced removal of exposed underlying aluminum. Reduced aluminum removal was not typically a concern because re-deposited aluminum did not readily diffuse through adjacent layers, and the aluminum was easy to remove with subsequent chemical processing. However, copper films are different. In their case, it is advantageous to develop etch and pre-metal deposition processes which, while accomplishing their intended tasks, do not remove a significant amount of exposed copper because of the copper's potential for producing mobile ion contamination. Therefore, a new via processing technique is taught, herein, which is intended to reduce the problems with copper-related contamination resulting from back-sputtering and removal of copper from exposed interconnect regions, whereby yield and reliability are improved. In addition, although the amount of copper removed during the pre-metal deposition processing is significantly reduced, sufficient precleaning and contouring or rounding of the opening's corners is still accomplished, whereby contact resistance is improved, step coverage is improved, and void formation is reduced during subsequent metal deposition processing.

Additionally, the film stress characteristics of many of the refractory metals used for forming copper barrier layers can vary significantly with respect to the overlying and underlying conductive and dielectric layers. This stress differential can cause significant reliability and yield problems. A method is described, herein, that teaches the deposition of a composite tantalum barrier layer, wherein, relative to each other, one portion of the layer is more tensile and another portion of the layer is less tensile, and whereby stress related complications are reduced. This tensile-engineered composite layer is formed by changing a duty cycle of the power supplied to the barrier chamber's coil with respect to the power supplied to the barrier chamber's target. In addition, the coil can also be utilized, in conjunction with the target, as a source for sputtering material onto the wafer, in order to form the composite film (e.g., one material from coil, another material from target) and/or improve the overall uniformity of a deposited layer across the wafer.

Therefore, the integration of the above improvements has resulted in much improved barrier and seed layer processes for use in copper interconnections. The above integration improvements can be further understood with specific references to FIGS. 1–14 herein.

FIG. 1 illustrates a multi-chamber integrated circuit deposition system 1. System 1 includes two robotically-controlled transfer chambers designed to move wafers from one point to another. The first robotic chamber is a buffer chamber 3, and a second robotic chamber is the transfer chamber 2.

Wafers enter the system 1 by being placed into one of the load locks 7, shown in FIG. 1. After the load lock 7 stabilizes at the appropriate temperature, pressure, etc., the buffer chamber 3 moves the wafer from the load lock 7 into the degas and alignment chamber 5. The degas and alignment chamber 5 will use a flat or notch formed within the semiconductor wafer to rotationally align the wafer for processing within system 1. In addition, the degas and alignment chamber 5 applies heat or energy to the wafer to remove organic contamination, water, or other undesirable material from the wafer prior to placing the wafer into to one of the various processing chambers. Such removal is done to reduce the likelihood that these materials will contaminate any of the chambers in the system 1.

Figure 2:
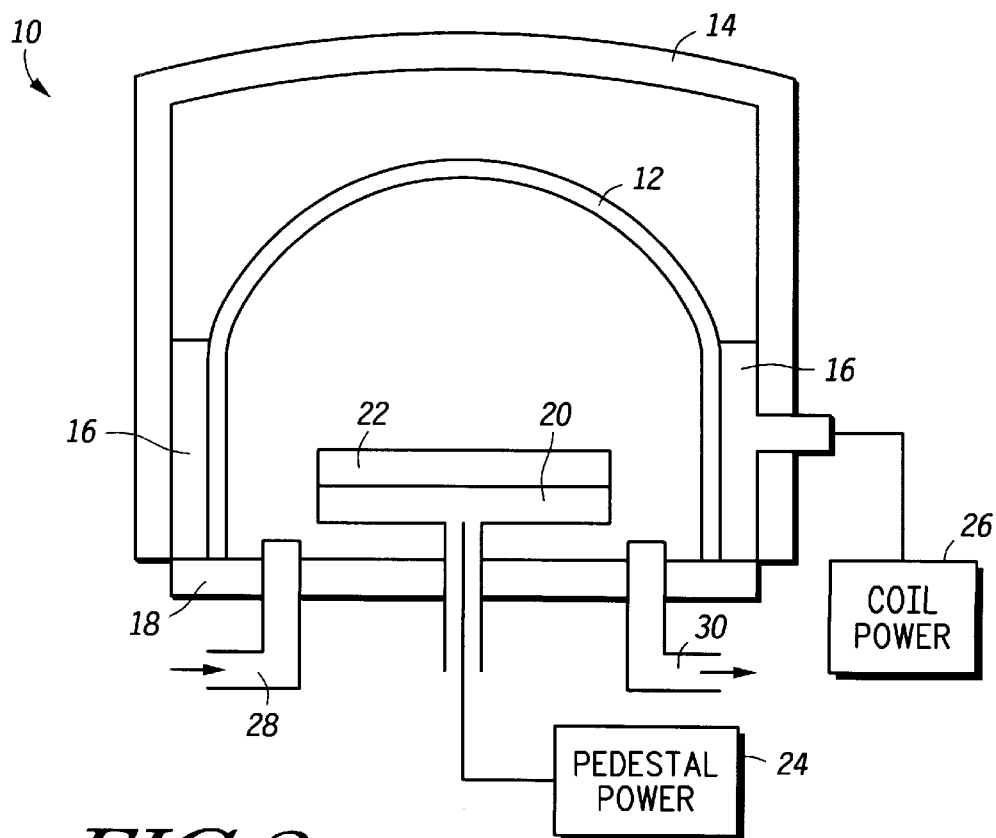
FIG. 2 illustrates, in a cross-sectional diagram, the radio frequency (RF) preclean chamber illustrated in FIG. 1 in accordance with the present specification.

After processing in chamber 5, the wafer is moved via the buffer chamber 3 to one of the radio frequency (RF) preclean chambers 10, shown in FIG. 1 (see also FIG. 2). The RF preclean chambers 10 are used to round corner portions of inlaid via and/or trench openings. In addition, the preclean chamber cleans exposed conductive surfaces of the semiconductor wafer in preparation for subsequent copper barrier and copper seed layer formation.

After being processed through the chamber 10, the wafer is transferred through transfer chamber 9 and into transfer chamber 2. Transfer chamber 2 then places the wafer into a barrier deposition chamber 40 (see also FIG. 3). The wafer's transfer between processing chambers via transfer chamber 2 is done in a controlled environment under controlled conditions whereby contaminants on the wafer during wafer transport are reduced. The barrier deposition chamber 40 deposits a copper barrier layer on the semiconductor wafer prior to depositing copper on the wafer. The barrier is preferably tantalum, or some other refractory metal or refractory metal nitride. Alternatively, it may be formed using other types of single or composite materials useful for forming barrier layers.

Figure 4:
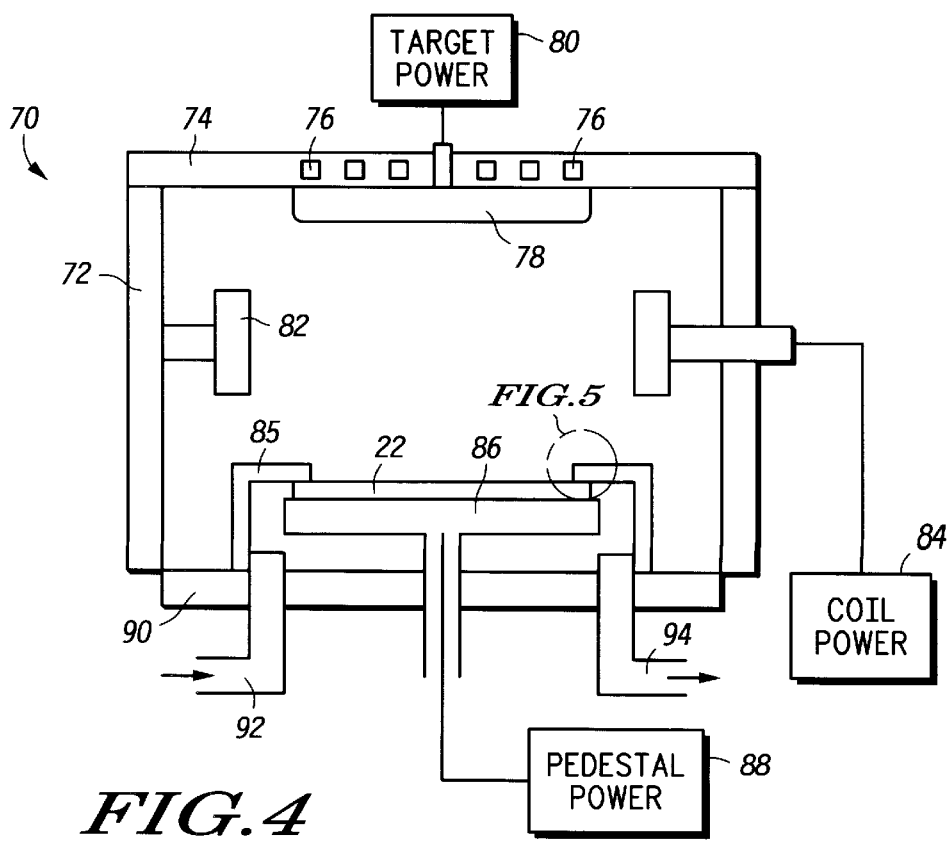
FIG. 4 illustrates, in a cross-sectional diagram, a copper seed layer deposition chamber as shown in FIG. 1 and in accordance with the present specification.

After forming the barrier layer, the wafer is transported to a seed layer deposition chamber 70 (see also FIG. 4). In chamber 70, a copper seed layer is formed on which copper can be electroplated, electroless plated, deposited, sputtered and/or the like. After forming the copper seed layer, the wafer is transported through chamber 9 into an optional cool down chamber (not shown) to cool the wafer before moving it into buffer chamber 3. The buffer chamber 3 then transfers the wafer from the chamber 9 back into the load lock 7, whereby the wafer is removed from system 1. Upon removal, the processed semiconductor wafer has a conductive barrier layer and copper seed layer formed over its exposed surfaces, and it is ready for bulk copper deposition and CMP.

The specific chambers within the multi-chamber deposition system 1 and their sub-components are discussed in more detail in FIGS. 3–7. The effect that system 1 has on a semiconductor wafer transported through the sequence discussed above is further illustrated in FIGS. 8–11, herein. In addition, the steps performed by the system 1, of FIG. 1, on a semiconductor wafer are further illustrated and discussed with reference to FIGS. 12–14, herein. Therefore, the discussion of the FIGS. 2–14 allow for a greater understanding of the process discussed above.

FIG. 2 illustrates in greater detail the RF preclean chamber 10, illustrated in FIG. 1. Chamber 10 includes a dome 12 that used to contain an RF preclean environment within the RF preclean chamber 10. Generally, the dome 12 is made of bead blasted quartz, to promote particle adherence. In addition, quartz is a dielectric material that allows external electric fields (e.g., fields from coil 16 discussed layer) to influence the preclean processing environment and effect the processing of the wafer. Therefore, while quartz is a preferred material, other materials that do not inhibit the passage of external electric fields may also be used.

The dome 12 is encased along the sides and top by a shield 14 and along the bottom by a base plate 18. The elements 14 and 18 are generally made of aluminum, or a like metallic material, capable of shielding radio frequencies (RFs). Located between the shield 14 and the dome 12 is coil 16. Coil 16 is cylindrical in shape and surrounds the quartz dome 12. The coil 16 is supplied with low frequency RF power via a coil power supply 26.

As illustrated in FIG. 2, a semiconductor wafer 22 is placed on a wafer pedestal 20 (wafer chuck) where it is subsequently processed. The wafer pedestal 20 is provided with high frequency RF power via a pedestal power supply 24. The wafer 22 can be secured to the pedestal 20 using a vacuum, mechanical clamps, electrostatic force, or the like. Alternatively, in some systems, the wafer may be left unsecured. FIG. 2 illustrates a gas supply line 28 which supplies gas to the internal chamber environment contained by the quartz dome 12. The gasses supplied the internal chamber environment are generally inert sputtering gasses and typically include argon, nitrogen, or xenon. In addition, FIG. 2 illustrates an exhaust port 30 which removes reacted and unreacted by-products from the chamber 10 and maintains pressure during wafer processing. Generally, the chamber 10 pre-processes and precleans the wafer 22 to round corners of the inlaid openings and to clean exposed conductive surfaces within the openings before depositing the barrier and seed layers. The precleaning process will be described in more detail with reference to FIGS. 9 and 12.

Figure 3:
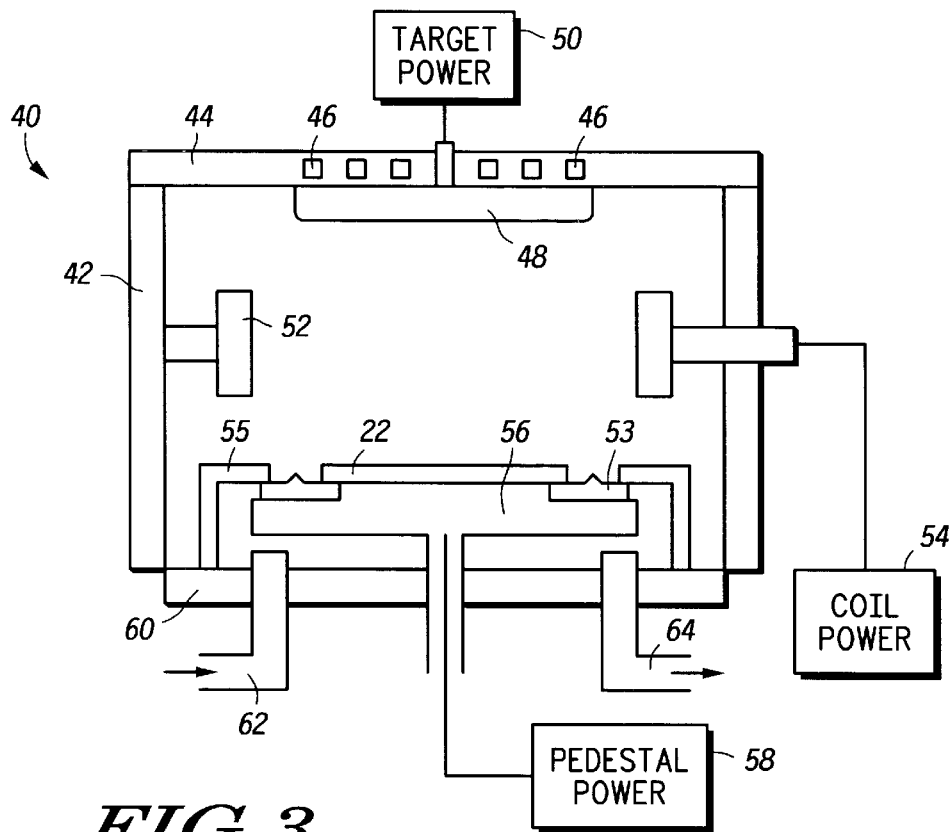
FIG. 3 illustrates, in a cross-sectional diagram, a barrier layer deposition chamber as shown in FIG. 1 and in accordance with the present specification.

FIG. 3 illustrates in greater detail the barrier deposition chamber 40, illustrated in FIG. 1. The barrier deposition chamber 40, of FIG. 3, includes a shield 42 made from aluminum or an aluminum arc sprayed stainless steel. On top of the shield 42 is a top plate 44. Top plate 44 contains or supports a rotating magnetic assembly 46. The rotating magnetic assembly 46 directs atoms towards a sputtering target 48 while sputtering barrier material from the target 48 onto the wafer 22. The sputtering target 48 is affixed to the bottom of the top plate 44 and is preferably made of tantalum (Ta). Alternatively, the barrier layer target can consist of other materials, such as tantalum nitride (TaN), titanium nitride (TiN), titanium tungsten (TiW), or the like. The target 48 is typically powered with direct current (DC) provided by a target power supply 50, as shown in FIG. 3.

An inner periphery of the housing 42 supports a coil 52. The coil 52 is connected to a coil power supply 54 whereby it can be biased during wafer processing. Wafer 22 is placed in chamber 40 atop a wafer pedestal 56 (wafer chuck). Wafers can be secured to the wafer pedestal 56 using a vacuum, mechanical clamps, electrostatic force, or the like. However, in the embodiment described herein, the wafer is unsecured to the wafer pedestal 56. The pedestal 56 is biased by a pedestal power supply 58. Specific bias conditions will be subsequently discussed in detail with reference to FIG. 14.

Within a base plate 60 are opening(s) through which an input gas source 62 is provided into the chamber, as illustrated in FIG. 3. The input gas source port 62 allows for various gases such as nitrogen, argon, and/or xenon to be introduced into the processing chamber 40 in order to more effectively perform the sputtering operation. In addition, FIG. 3 illustrates an exhaust port 64 which is used to remove residual by-products of the sputtering operation as well as to regulate pressure within the chamber during the sputter processing of the wafer 22.

To ensure that wafer 22 is efficiently biased by the pedestal power supply 58, a dielectric isolation ring 53, illustrated in FIG. 3, is used to prevent electrical contact between wafer pedestal and other conductive chamber components. The dielectric isolation ring 53 is preferably made of a ceramic material. However, it has been found that tantalum (Ta) which is inherently sputtered from the tantalum target 48, onto the ceramic isolation ring 53, does not adhere well, whereby tantalum peeling from the ceramic isolation ring 53 occurs frequently and increases particle contamination on the wafer 22. This particle contamination noticeably reduces die yield. Therefore, in accordance with one embodiment of the present invention, the top, exposed, surface of the ceramic or dielectric isolation ring 53 is coated with a layer of arc sprayed aluminum or flame sprayed aluminum. This added surface on the ceramic isolation ring 53 improves the adhesion of tantalum to the isolation ring 53 during tantalum deposition, whereby particle control in the chamber is significantly improved over isolation rings used in the prior art.

In addition, it has been found that tantalum (Ta) sputtered from the target 48 will also readily deposit on other components within the chamber 40. As an example, tantalum can deposit upon the shield 42, the clamps 55, or other components within the chamber 40. Generally, the tantalum does not adequately adhere directly to these components, over time. If the sputtered tantalum does not adhere well to these components, it will flake causing particle count increases that adversely affect yield and increase system downtime.

To avoid these problems, it has been found that, upon cleaning the chamber 40, a conditioning step should be performed on the chamber 40 prior to reintroducing wafers into chamber 40. This conditioning step involves introducing nitrogen into the chamber 40, through the gas input line 62, while reactively sputtering Ta from the target 48 in the nitrogen ambient. As an example, in one embodiment, this is accomplished in a reactive sputtering deposition system by powering the target 48 in a range of approximately 1300–1700 watts (W), powering the coil 52 in a range of approximately 1300–1700 W, and/or powering the pedestal 56, via the power supplies 50, 54, and/or 58, such that deposition of a tantalum nitride film is formed over portions of the inner surface of chamber 40 and its components. The tantalum nitride film is deposited to a thickness in a range of approximately 0.25–0.75 micron. During the conditioning step, a metal disk is placed over the pedestal to prevent sputtered material from depositing on the heater. This conditioning step coats critical internal chamber components with TaN, whereby adhesion of subsequently deposited tantalum onto the chamber components during wafer processing is improved. After a specified number of wafers have been processed through the chamber 40, another chamber maintenance cleaning procedure and another conditioning operation to deposit tantalum nitride (TaN) over the internal chamber components are again performed. In an alternate embodiment, a composite TaN target may alternatively be used to deposit the tantalum nitride layer over the internal chamber components, instead of sputtering Ta off of a target in a nitrogen environment to form the TaN layer.

FIG. 4 illustrates in greater detail the barrier deposition chamber 70, illustrated in FIG. 1. In a manner similar to FIG. 3, the chamber 70 comprises a shield 72, a top plate 74, a rotating magnet assembly 76, a copper target 78, a target power supply 80, coils 82, a coil power supply 84, a wafer pedestal 86, a pedestal power supply 88, a bottom plate 90, an input gas source 92, and an exhaust port 94 similar to the elements previously discussed. However, the wafer support and clamping structure, of FIG. 4, differs from that shown in chamber 40, of FIG. 3. Where the wafer in FIG. 3 was free standing in chamber 40, the wafer in FIG. 4 is clamped to the wafer pedestal 86, of FIG. 4, using improved clamp 85.

During operation, the power supplies 80, 84 and 88 power the system while an argon (Ar) or like inert gas is provided through input 92 to the chamber 70. This results in copper being sputtered from target 78 and onto the wafer 22. The improvement herein described is not so much in the process as it is in the specific improved clamp 85, used in FIG. 4. Therefore, a detailed discussion of the clamps 85 is provided via FIGS. 5–7.

Figure 5:
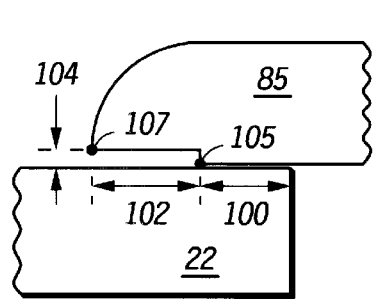
FIG. 5 illustrates, in a cross-sectional diagram, a magnified clamp portion of FIG. 4 which shows, in greater detail, the specific clamp of FIG. 4 in accordance with the present specification.

The clamp 85, shown in FIG. 4, has been redesigned to reduce copper peeling at peripheral regions of the wafer, thereby reducing particulates and particulate related yield problems during IC manufacture. FIG. 5 illustrates a magnified cross-section of an inner periphery portion of the clamp shown in FIG. 4 and further illustrates its position and function relative to the wafer 22. The contact portion 100, of the clamp 85, is used to secure the wafer to the underlying wafer pedestal, or support member (not shown). The elevated region, which is positioned at the inner diameter of the clamp, is referred to as a shadow portion. It is located above a region 102, at a peripheral portion of the wafer 22. FIG. 5 shows that the shadow portion of the clamp 85 is positioned at a distance 104 above the surface of wafer 22. An important point in the design of the clamp, shown in FIG. 5, is point 105 which is where the clamp 85 contacts, or is in close proximity to, the wafer 22. Generally, if the point 105 is not properly engineered relative to other dimensions of the clamp, it will be subject to unwanted deposition of sputtered copper. This can be a problem when unclamping the wafer. When the wafer is unclamped, copper formed continuously over both the wafer and the clamp, near point 105, has a tendency to tear from both of these surfaces. This can produce particles, and it can also be the source of subsequent peeling of the copper film, from the wafer, during later processing.

Figure 7:
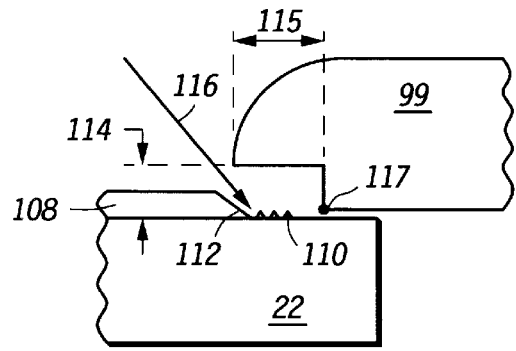
FIG. 7 illustrates, in a cross-sectional diagram, the unfortunate repercussions of using a clamp with improper geometries.

The improvement(s) in the design of FIG. 5 can be best understood and discussed with respect to the prior art clamp 99, illustrated in FIG. 7. While the clamp 99 secures wafer 22, a copper or copper seed layer 108 is sputtered from an overlying target. If the height 114, of the shadow portion, is too high, then copper can be sputtered along a path, such as path 116, and formed on the wafer in regions under the shadow portion. The copper formed in these regions can have a graded thickness (from thick to thin) and can eventually terminate as copper nodules at the outermost areas under the shadow portion 115. This shadow portion is located toward a peripheral portion of the wafer 22. The copper nodules 110 and graded copper portions 112 are problematic in that they will plate in subsequent copper plating operations in a nonuniform manner. Additionally, copper plating and chemical mechanical polishing (CMP) operations performed on copper nodules 110 and graded copper portions 112 have a potential to significantly and adversely peel from the wafer over time. Therefore, a need exists in the art to reduce formation of copper nodules 110 and graded copper regions 112 whenever possible.

In addition, prior art clamps, as in FIG. 7, sometimes create a shadow region with 115 that is not wide enough. If this region 115 is too narrow and/or the height 114 is too great, a point 117 that typically contacts the clamp 99 to the wafer 22, also has a potential to have copper deposited over and around it. Eventually, enough copper will form on the point 117 to result in tearing or ripping of the copper layer 108 at point 117 when separating the clamp from the wafer. This has the potential to generate particles from the edges of the wafer 22, whereby yield can be affected. Therefore, in order to develop an improved and functional clamp, for use with formation of a copper or copper seed layer, the dimensions 115 and 114 must be carefully engineered beyond those currently existing in the art.

FIG. 5 illustrates such an improved clamp 85 whereby the dimension 104 is less than the height dimension 114 of FIG. 7. Specifically, the prior art has not made a clamp having a shadow portion with a dimension 114 less than 8 mils. Such "high" shadow portion standoff from the wafer 22 is at least partially responsible for the problems discussed above for clamp 99. In FIG. 5, the dimension 104 of clamp 85 is engineered to be less than 8 mils. In a preferred embodiment, the dimension 104 is less than 5 mils and in some cases is made less than 3 mils. Generally, dimension 104, of FIG. 5, is some value within a range of roughly 2 to 5 mils, in most cases. Decreasing the dimension 104 reduces the amount of copper formed under the shadow portion which correspondingly reduces the problems with the graded copper and copper nodules under the shadow portion. It is important not to allow the wafer to come into contact with the inner periphery 107 of the clamp of FIG. 5. This is important, else the tearing problem previously discussed with respect to point 117 of FIG. 7 will occur, except this time such copper buildup and tearing will occur at point 107 as opposed to point 105 of FIG. 5. Therefore, there is good reason not to lower the standoff dimension 104 to a point less than some threshold that varies depending upon the wafer topography and the thickness of the deposited barrier, seed and/or copper layer.

In addition, the dimension 102, in FIG. 5, is generally set at 20 mils or greater to ensure that diagonal deposition path 116 (as illustrated in FIG. 7) will not result in adverse buildup of copper material on the point 105. This lengthening of the relative dimension of 102 versus the dimension 104 further ensures that tearing of peripheral portions of the seed layer is avoided, or substantially reduced. In summary, the improved clamp 85 reduces the copper grading 112 and copper nodules 110, illustrated in FIG. 7, whereby peripheral copper peeling and particles have been substantially reduced. In addition, the newly designed clamp 85 ensures that copper build-up near surfaces of the clamp 85 contacting the wafer does not occur, whereby copper is not adversely torn from the surface of the wafer 22 during copper seed layer formation.

In essence, the problem illustrated in FIG. 7 is due to the rectangular two-dimensional shape defined by the dimensions 115 and 114. By changing the shape of the rectangular region defined in FIG. 5, via distances 102 and 104, improved copper seed layer formation will result. Therefore, instead of describing the clamp improvement via the specific dimensions 102 and 104 described previously, it can alternatively be stated that the dimension 102, or overhang, should be at least 2.5 times the dimension 104, or height, of the shadow portion above the surface of the wafer. Conservatively, the distance 102 should be at least 4.0 times the distance 104. Such geometric relationship will ensure that the formation of graded copper 112 and nodules 110, of FIG. 7, is reduced or avoided, while simultaneously ensuring that the copper seed layer is not torn from the wafer at contact point 105 or perimeter point 107, of FIG. 5.

Figure 6:
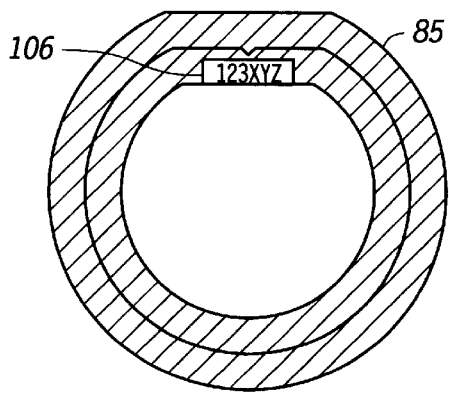
FIG. 6 illustrates, in a top-perspective view, the clamp of FIG. 5 in accordance with the present specification.

FIG. 6 illustrates the clamp 85, as used in the chamber 70 of FIG. 4, from a top perspective view. Most semiconductor wafers 22 contain an alphanumeric identification region 106 which typically contains laser scribed characters across the surface of the wafer. In the chamber 40, of FIG. 3, these alphanumeric characters were processed and covered with the Ta barrier layer. The barrier layer is so thin and the alphanumeric characters are so deeply formed, by comparison, that the alphanumeric characters are not distorted, filled, or effectively erased by the deposition of the barrier layer within the alphanumeric character's topography. However, the copper seed layer, which is subsequently formed to a thicknesses of potentially greater than 0.4 micron, could completely obscure or substantially distort the alphanumeric identification region 106. Therefore, the clamp 85, illustrated in FIGS. 4 and 5, is machined in FIG. 6 in a ring shape which has a portion that covers the alphanumeric identification region 106 when the clamp is positioned over the wafer. By doing so, the copper seed layer is formed in regions exclusive of the alpha numeric identification region, whereby these identification symbols are preserved even after copper plating has occurred.

Therefore, collectively, FIGS. 5–6 illustrate an improved clamp structure which is used within the seed layer deposition chamber 70 of FIG. 4 to improve copper interconnect processing.

FIGS. 8–11 illustrate, in cross-sectional diagrams, a method for forming a dual inlaid copper interconnect structure using the system previously illustrated in FIGS. 1–6.

Figure 8:
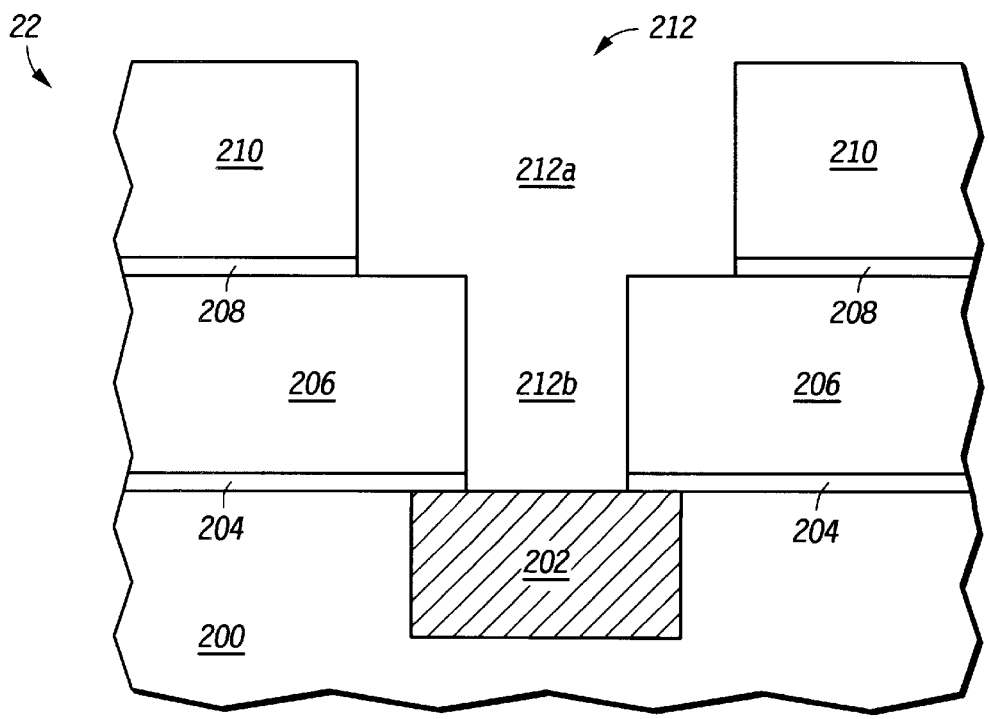
FIGS. 8–11 illustrate, in cross-sectional diagrams, a method for forming a copper interconnect using the system illustrated in FIGS. 1–6 in accordance with the present specification.

FIG. 8 illustrates a dielectric region 200 formed over a substrate. In a preferred form, the substrate is a silicon wafer. However, other substrates may be used in accordance with the teachings herein, such as silicon carbide, germanium silicon, germanium, gallium arsenide, other III–V compounds, silicon on insulator (SOI) substrates, and like semiconductive materials. On top of this substrate are formed various conductive and dielectric layers. These layer include, but are not limited to materials such as metals, refractory metals, silicides, polysilicon, nitrides, oxides, and/or the like. These layers on top of the substrate form various active devices, passive devices, and interconnect regions between electrical devices on the substrate surface.

One such interconnect region is illustrated as interconnect 202 in FIG. 8. In a preferred form, interconnect 202 is made of a copper material and is preferably a dual inlaid or single inlaid structure having the appropriate barrier layers (not specifically illustrated in FIG. 8). On top of the interconnect 202 is formed an etch stop layer 204 such as silicon nitride, silicon-rich silicon nitride, silicon oxynitride, plasma enhanced nitride, and/or like materials or composites. Over the etch stop layer 204 is formed one or more dielectric layers 206. The dielectric layers 206 include one or more tetraethylorthosilicate (TEOS), borophosphosilicate glass (BPSG), phosphosilicate glass (PSG), fluorine doped TEOS, low-k dielectrics, oxynitrides, and/or like dielectrics or composites thereof. Over the layer 206 is formed a second etch stop and anti reflective coating (ARC) layer 208. The materials used to form layer 208 are similar to the materials used to form layer 204. On top of the layer 208 is another dielectric layer 210 which is formed with materials and processing similar to that previously discussed for dielectric layer 206.

After formation of the layers 204–210, a photolithographic process is used in conjunction with an etch process to form a single inlaid or dual inlaid opening through layers 204–210, as shown in FIG. 8. In FIG. 8, a dual inlaid opening is illustrated having a trench portion 212a and a via portion 212b. The opening 212 may be formed "via first/trench last", "trench first/via last", or in any other manner which creates the resulting overall structure shown in FIG. 8.

Figure 9:
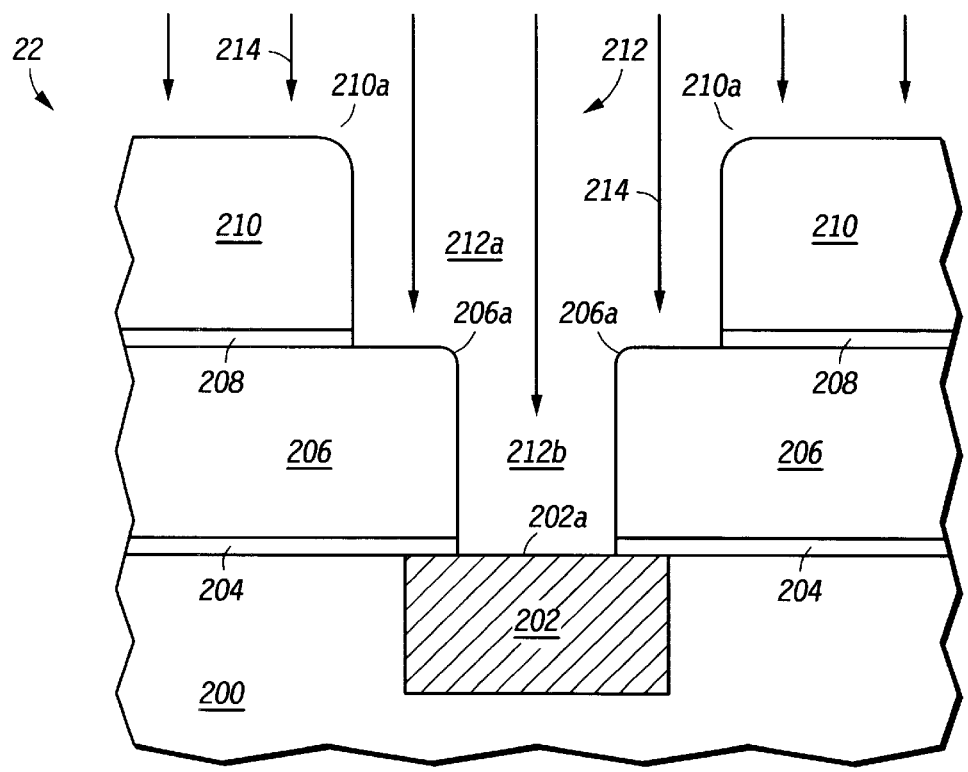

After formation of the structure illustrated in FIG. 8, the wafer 22 is placed into the load lock 7 of system 1, illustrated in FIG. 1. The wafer is transferred into the RF preclean chamber 10, as taught herein. Within RF preclean chamber 10, wafer 22 is etched by ionizing an inert gas, such as argon or xenon, in the presence of an electric field that directs the ionized particles 214 to the wafer surface, as illustrated in FIG. 9. The ionized particles 214 impinge upon the surface of layers 210, 206, and 202, as shown in FIG. 9. However, the ionized particles 214 are powered in a manner such that rounded corners 210a and 206a are formed without significantly sputtering, or removing, portions of exposed copper layer 202 from the exposed surface 202a. Such selective removal, based on depth, is done by powering a coil 16, using coil power supply 26, to a high level of RF power and powering the wafer pedestal, using pedestal power supply 24, to a relatively low level of RF power (see also FIG. 13). This power differential ensures that a higher etch rate from ion bombardment occurs along upper exposed surface portions relative to lower exposed surface portions (e.g., corners 210a are rounded to a greater degree than the corners 206a because the surface 210 is etched at a higher rate than is surface 206). Further, the exposed surface 202, at the bottom the opening, is subject to the least amount of ion bombardment, and is therefore the portion of the opening from which the minimum amount of material is removed or sputtered. Further, the amount of material removed from each of the corners 210a and 206a is greater than the amount of material removed from the surface 202a. The rounding of the corners improves the step coverage of subsequently deposited barrier and conductive films and helps to reduce voiding in the bottom of the opening by allowing these films to be deposited more uniformly within the opening.

Figures 13, 14:
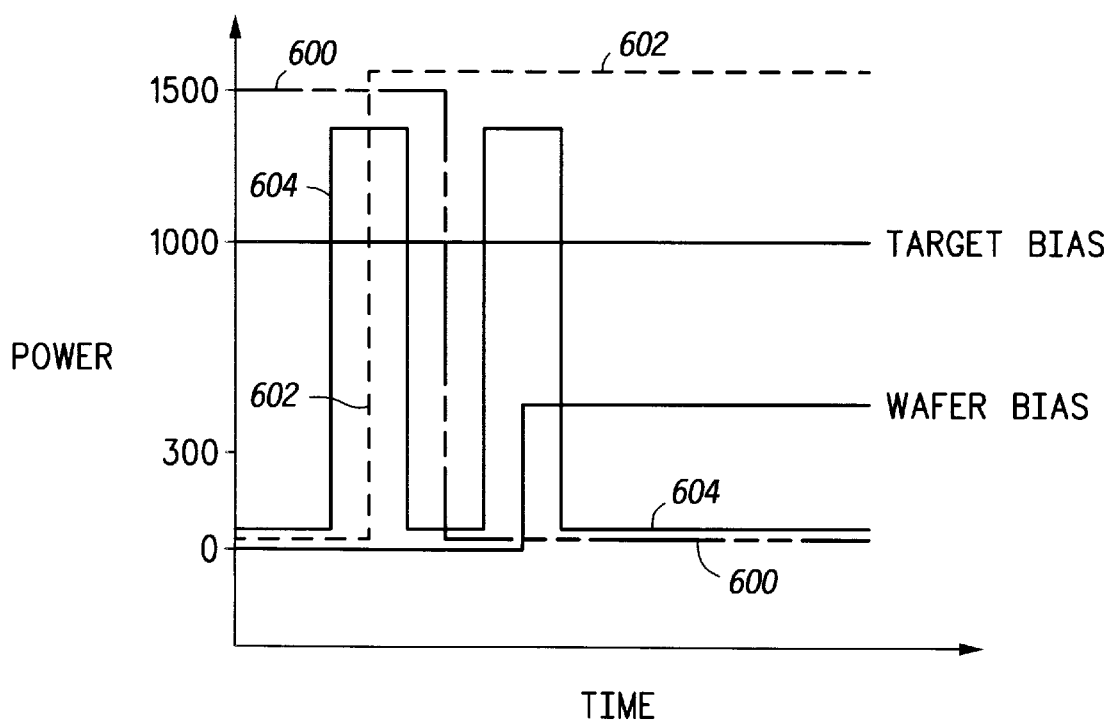
FIG. 13 illustrates, in a table, a comparison of prior art aluminum preclean methods with new copper preclean techniques used in accordance with the present specification.
FIG. 14 illustrates, in an XY plot, the powering sequence used for the coil, target, and wafer in a barrier layer deposition chamber so that the barrier layer may be formed in accordance with the present specification.

In the prior art, the coil power and the wafer pedestal power (wafer power) were typically set to equal levels such as 200 watts (see FIG. 13 for an example). Such equal power levels were used since removal or sputtering of exposed aluminum in an aluminum interconnect is not adverse to integrated circuit yield and reliability. However, copper that is back-sputtered and removed from surface 202a, in FIG. 9, and then re-deposited over dielectric layers 210 and 206 can adversely affect yield, unlike prior art aluminum. Any deposited copper on layers 210 and 206 will readily diffuse through layers 210 and 206, potentially causing device contamination and yield loss. In addition, copper contaminants cannot readily be removed by chemical processing or etching, as was the case with aluminum. Therefore, it is advantageous to device reliability that the process of FIG. 9 reduce the removal rate of copper from the surface 202a, of interconnect 202.

In summary, the process of FIG. 9, performed in the chamber 10 of FIG. 2, forms rounded corners 210a and 206a that improve step coverage and reduce subsequent voiding of copper interconnects while simultaneously reducing the possibility of producing yield-reducing copper contamination by reducing rates of sputtering of copper off the surface 202a.

Figure 10:
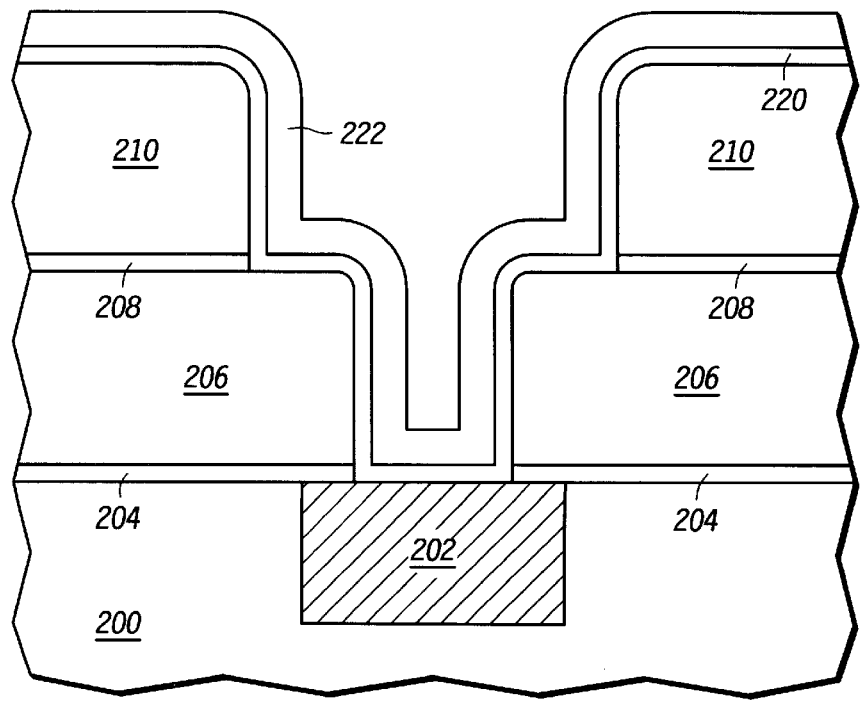

After performing the preclean processing described using FIG. 9, the wafer 22 is moved from the chamber 10, in FIG. 1, to the barrier deposition chamber 40, in FIG. 1. Note that the chamber 40, of FIG. 1, is also illustrated in greater detail in FIG. 3. FIG. 10 illustrates that a barrier layer 220 is deposited overlying the surface of the wafer previously illustrated in FIG. 9 using the chamber 40, illustrated in FIGS. 1 and 3. Typically, the layer 220 is formed between approximately 200 angstroms in thickness and 750 angstroms in thickness and is preferably a tantalum (Ta) layer. In a preferred form, portions of the layer 210 are incrementally deposited as less tensile layers while other portions of the layer 210 are deposited as more tensile layers to engineer the stress of the composite layer 220. In other words, at least one higher tensile portion of layer 220 is formed and at least one lower tensile portion of layer 220 is formed in FIG. 10 to form a complete Ta barrier layer. Such formation of the barrier layer 220 reduces stress-related reliability concerns in IC manufacturing, and generally improves IC yield. A specific manner which may be used to form the composite higher-tensile and lower-tensile layer 220 is more specifically set forth with following references to FIGS. 12 and 14.

After formation of the barrier layer 220 in chamber 40, of FIG. 1, the wafer 22 is moved from chamber 40 to chamber 70. Note that the chamber 70 is illustrated in further detail in FIG. 4, herein. In FIG. 4, the improved clamp shown in FIGS. 5 and 6 and discussed above is used to form an improved copper seed layer 222 over the barrier layer 220 in FIG. 10. Generally, the layer 222 is formed as a copper layer and generally is formed between 100 angstroms and 2000 angstroms in thickness. Sometimes, especially with near vertical via sidewalls, the thickness of the seed layer is greater on planar surfaces that on sidewall surfaces. However, the rounded corners 210a and 206a, illustrated previously in FIG. 9, can improve upon such step coverage. In addition, the use of the improved clamp of FIGS. 5 and 6 in the process of FIG. 10 greatly improves yield, especially at the periphery of the wafer, over the hardware and processes used in the prior art.

Furthermore, it was found that sputtering the seed layer and/or the barrier layer from both the chamber coil and the chamber target greatly improved uniformity. In addition, a copper seed layer coil having a grain size of less than 50 micron was found to improve the quality of the copper seed layer as well as potentially providing benefits with respect to electromigration and reliability. In a preferred embodiment, the seed layer coil grain size is less than approximately 25 micron and in a range of 5–15 micron. Generally, in the prior art, it was believed that the grain size of the coil had little affect on the quality of the copper seed layer.

In addition, uniformity of the copper seed layer is further controlled and improved by intentionally sputtering material from both the coil and the target. This is not the same as residual sputtering unintentionally occurring from the coil. In the art, it is undesirable for material to be sputtered from the coil since the art saw no advantage in such sputtering and such sputtering only limited the lifetime of the coil. However, in any sputtering system, there will always be some infinitesimal and inconsequential sputtering of material from chamber components. The process taught herein teaches a larger scale and more deliberate sputter rate from the coil, whereby a substantial portion of the deposited layer is material removed from the coil. For example, embodiments of the present invention provide that at least a minimum of 5% of the overall material in the copper seed layer originate from the coil, whereas typically, in the prior art, no more than 1–2% of the material in the copper seed layer originates from the coil. Additionally, the coil and the target may either be formed of copper, copper alloys, or dissimilar materials in order to form a composite layer on the wafer. In summary, intentionally powering and sputtering from the coil provides an unexpected benefit of providing additional control of the uniformity of the deposited layer.

Figure 11:
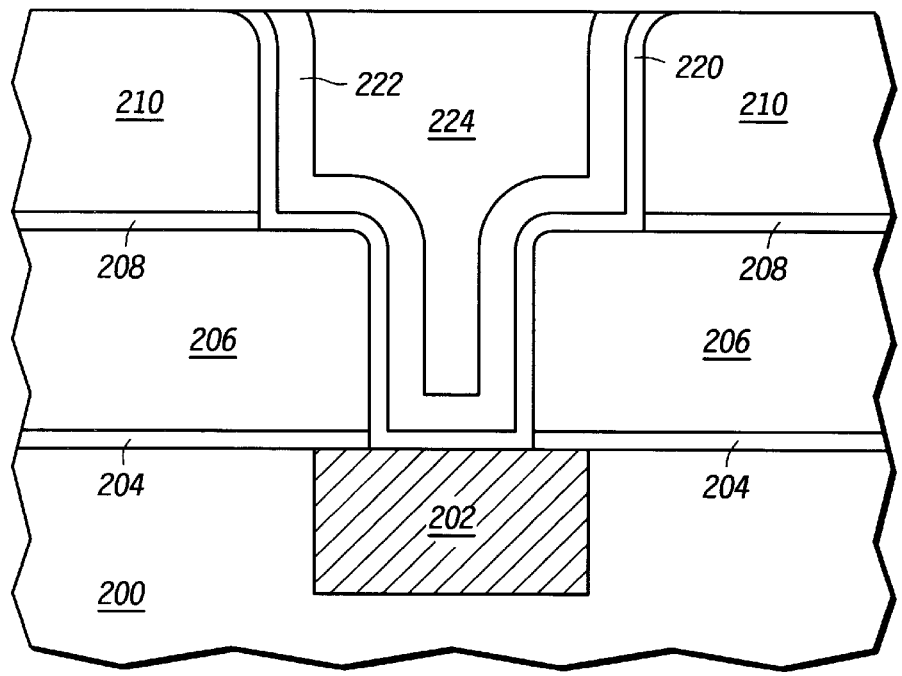

FIG. 11 further illustrates the dual inlaid opening of FIG. 10 after depositing a copper fill material and forming a dual inlaid interconnect structure. In FIG. 11, an electroless, electroplating, or CVD process has been used to deposit a copper film 224 over the seed layer 222 and within the dual inlaid opening. Therefore, a copper layer 224, which substantially fills the opening and has reduced or no voiding, is formed over the seed layer 222. Typically, the thickness of the copper layer 224 is between 5000 angstroms and 1.2 micron. After formation of the layer 224, a chemical mechanical polishing (CMP) process is performed to remove portions of the copper layer 224, the seed layer 222, and the barrier 220 not contained within the dual inlaid opening. This polishing process creates the dual inlaid interconnect structure, as shown in FIG. 10.

Figure 12:
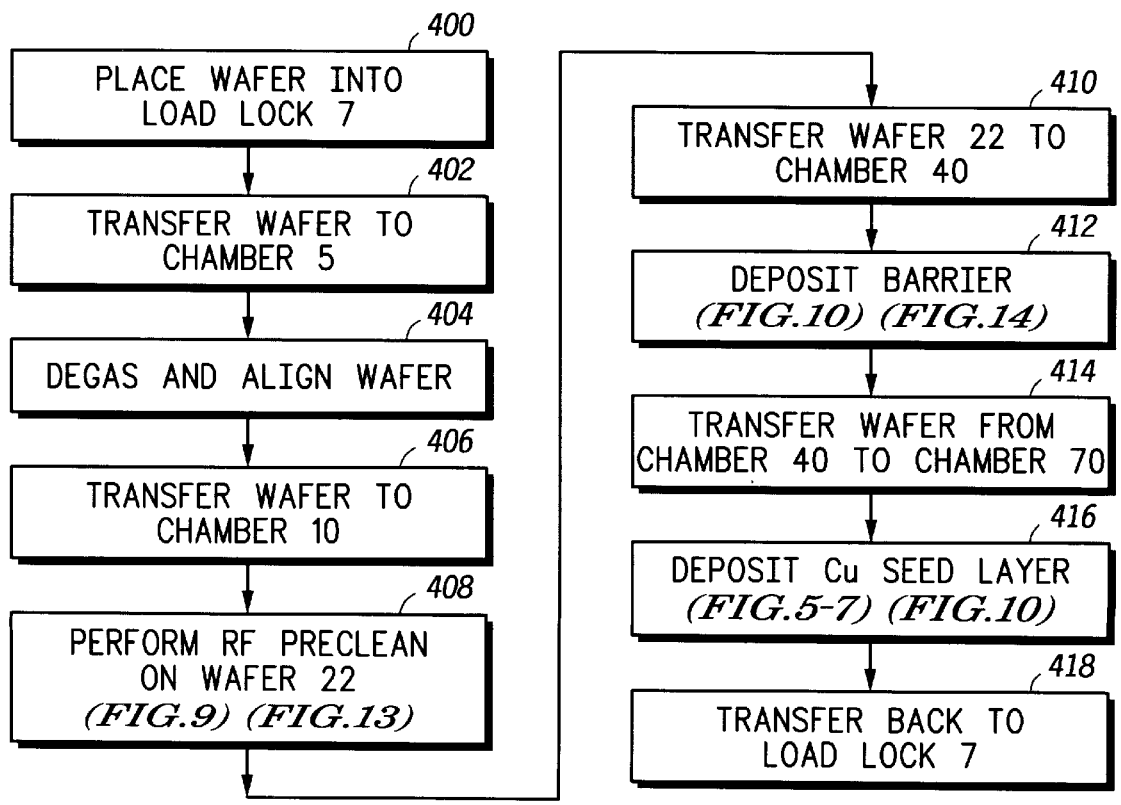
FIG. 12 illustrates, in a flow chart, a method for forming a barrier layer and seed layer for use in a copper interconnect in accordance with the present specification.

FIG. 12 illustrates, in a flow chart, an integrated process from the point a wafer is placed into system 1, of FIG. 1, to the point where the wafer is removed from system 1, of FIG. 1. In a first step 400, the wafer 22 is placed into the load lock 7, of FIG. 1. In a step 402, the wafer is transferred from the load lock 7 to the degas chamber 5, via the buffer chamber 3. In chamber 5, the wafer is heated to remove organics and moisture from the surface of the wafer to prepare it for subsequent processing in other chambers. In addition, chamber 5 spatially aligns the wafer to a wafer notch or wafer flat.

In step 406, the wafer is transferred from chamber 5 to chamber 10, via the buffer chamber 3. Chamber 10 is used to RF preclean the wafer 22. The specific preclean conditions of step 408, are compared to the prior art preclean conditions in FIG. 13. The process and its effects are further illustrated in the cross-sectional diagram of FIG. 9. In FIG. 13, the prior art preclean process would power the coil and the wafer to roughly the same power level. These power setting were done for throughput reasons. When the coil and wafer power were both set to a high power (e.g., 200 watts) the preclean process would removal material from all surfaces of the wafer at a high rate. Therefore, the high power process was desired for throughput reasons, whereby a significant amount of underlying exposed aluminum, within the opening, was also inadvertently sputtered onto the surfaces of the wafer. However, the prior art process was not concerned with aluminum sputtering since sputtered aluminum could be removed and aluminum was not a contamination concern.

However, step 408, of FIG. 12, is a preclean process in the presence of exposed copper on the surface 202a, shown in FIG. 9. In accordance with one embodiment of the present invention, the coil power for this process is increased to 300 watts or greater while the wafer power is decreased to 100 watts or less to create a power gradient. These powers are conservative numbers, and it is simply necessary to maintain roughly a 2:1 power ratio from the coil power to the wafer power. This power gradient ensures that sputtering or removal of material from the exposed top surfaces of layer 210 is greater than the removal or sputtering of material from the exposed surfaces of layer 206, which in turn are both greater than the amount of material sputtered from the exposed copper surface 202a, at the bottom of the opening, in FIG. 9. Therefore, the advantageous rounding of corners 210a and 206a in FIG. 9 will still occur (with corner 210a being slightly more rounded than corner 206a) where such rounding will improve step coverage and reduce voiding. In addition to providing the advantageous rounded profile, the power gradient minimizes copper removal from surface 202a, of FIG. 9, whereby contamination, which was never a concern in prior art aluminum processing, is minimized for copper interconnects.

Returning from FIG. 13 to FIG. 12, a step 410 follows step 408. Step 410 transfers the wafer 22 from the preclean chamber 10, of FIGS. 1–2, to the chamber 40, of FIG. 1 and FIG. 3. In a step 412, the chamber 40, of FIG. 3, deposits the barrier layer 220, shown in FIG. 10. The barrier film deposition is performed in accordance with the process sequence illustrated and described in FIG. 14.

In FIG. 14, after the wafer is placed within the chamber 40 and the chamber is allowed to stabilize, a power of 1000 watts (target bias) is applied to the target 48, of FIG. 3. Power is applied continuously during the deposition of the barrier layer 220, of FIG. 10. Although the target power is shown as specifically having an applied power of 1000 watts, any other power setting can be used depending upon the desired processing results and the type of deposition equipment used. During an initial period of time during the barrier deposition process, the power applied to the target bias is 1000 watts and the power applied to the wafer 22 (wafer bias), via pedestal power supply 58 of FIG. 3, is set to a low value or zero watts. After the initial period of time, the wafer bias is changed from approximately zero watts to 450 watts to back-sputter barrier material from the bottom of the interconnect opening onto the sidewalls of the opening and improve the overall coverage of the barrier film within the opening. The shape of the waveform applied to the wafer bias can be different than that illustrated in FIG. 14. Furthermore it can ramp to other power levels, other than 450 watts, depending on the desired process results and the type of equipment used. Some systems may not bias the wafer at all during the barrier deposition process.

FIG. 14 illustrates that, in conjunction with the preferred target bias power waveform and the wafer bias power waveform, one of three possible coil power waveforms 600, 602, and 604 may be used. The first coil power waveform 600 illustrates that the coil 52, of FIG. 3, is powered on at approximately the same time as the target 48. Therefore, waveform 600 indicates that the coil is powered to approximately 1500 watts at approximately the same time that the target 48 is initially powered to approximately 1000 watts. Although approximately 1500 watts is indicated by waveform 600, other power levels may be used, if necessary, to accommodate various processes and equipment. After a specified period of time has passed, as illustrated by waveform 600 in FIG. 14, coil power is removed or reduced before terminating the barrier deposition process. In other words, an initial portion of the barrier film 220, in FIG. 10, is deposited during a high coil power processing sequence and another portion of the film 220 is deposited during a low or zero coil power processing sequence. Those portions of the tantalum barrier formed during the initial time period while the coil is being powered have different stress properties as compared to those portions of the tantalum barrier formed when relatively lower amounts of power are applied to the coil. During the time the coil is powered, a less tensile tantalum barrier film is deposited. During the time coil power is removed or reduced, a more tensile tantalum barrier film is deposited. Therefore by selectively controlling the power to the coil during deposition of the barrier, the stress of the barrier can be engineered to accommodate the respective stresses of overlying and underlying layers, whereby adhesion and overall IC yield is improved.

The difference in the stress characteristics of the different barrier portions discussed above is believed to result from different rates of Argon (or like inert gases) incorporation into the deposited barrier portions occurring as a result of the increased power applied to the coil. Specifically, when the coil is powered, the Argon in the chamber is ionized to a greater extent and may be deposited in larger quantities within the barrier film. When the coil is not powered, less Argon is ionized in the chamber 40 (see FIG. 3), whereby less Argon is incorporated into the barrier film. This difference/gradient of Argon through the depth of the film will therefore be proportional to the coil duty cycle curve (one of curves 600, 602, or 604 in FIG. 14). It is believed that these gradients of Argon in the final barrier film contribute to the improvement in the stress characteristics of the barrier layer 220, of FIG. 10.

FIG. 14 illustrates another possible coil power waveform 602 whereby the coil 52, of FIG. 3, is initially turned off while the target power is enabled. After an initial barrier deposition period where no coil power is applied, the coil power is enabled, as shown for curve 602, of FIG. 14. Therefore, waveform 602 is basically the inverse of waveform 600, whereby the waveform 602 produces a barrier film having an inverted stress profile as compared to the film formed via curve 600. When using the waveform 602 processing sequence, a more tensile tantalum film is initially deposited during the first phase of the deposition process and a less tensile tantalum film is deposited during the second phase of the deposition process.

FIG. 14 illustrates yet a third possible waveform 604 which may be used to form the barrier layer 220, of FIG. 10. Waveform 604 shows that pulsed power (either periodic or nonperiodic) is applied to the coil 52. When using a pulsed coil power waveform as in FIG. 14, alternating layers or portions of less tensile and more tensile tantalum can be incrementally deposited on the wafer 22 to form the barrier layer 220, of FIG. 10. Therefore, it has been determined that selectively powering on and off the coil at least once during the deposition process can be used to tune the stress of the barrier layer to accommodate a plurality of differing constraints or conditions. In addition, although FIG. 14 shows primarily step coverage wave forms, the waveforms that can be used on the coil, target, and/or wafer need not be step function curves over time. For example, it is possible to use triangle-shaped (sawtooth) waveforms, sinusoidal waveforms, logarithmic power curves, exponential power curves, combination thereof, or any other types of analog, continuous, or quantized wave forms to produce different types of stress characteristics of the tantalum (or refractory metal based) barrier layer 220 of FIG. 10. Alternatively, this processing methodology can be used with a variety of other conductive films, such metals, refractory metals, and refractive metal nitrides which may be prone to stress related problems. In addition, while less tensile and more tensile are used to described the relative stress of materials throughout this specification, those skilled in the art will appreciate that the terms less tensile and more compressive can be used interchangeably.

Returning to FIG. 12, once the step 412 is completed as illustrated in FIG. 14 and discussed above, the wafer 22 is transferred in a step 414 from chamber 40 to chamber 70. Chamber 70 is illustrated in FIG. 1, and it also illustrated in greater detail in FIG. 4. After transferring the wafer 22 into chamber 70 via step 414, a step 416 is used to deposit the copper seed layer 222 of FIG. 10 over the wafer 22. This deposition process utilizes the improved clamp 85 discussed with respect to FIGS. 4–6. Therefore, the copper seed layer is deposited, and the semiconductor device potentially experiences improved yield due to a reduction in peeling of subsequent copper layers near the periphery of the wafer during CMP and/or copper plating operations.

In a step 418, after deposition of the copper seed layer 416, the wafer 22 is transferred from chamber 70, through chamber 2, to chamber 3, then back to the load lock 7 in FIG. 1. At this point, the load lock 7 is stabilized to atmospheric conditions and the wafer 22 is removed from the system 1. The wafer is then transferred to a copper electroplating, electroless plating, or CVD chamber (not shown herein) whereby the copper interconnect metallurgy is deposited. After such metallurgical processing is complete, a chemical mechanical polishing (CMP) process is used to form the inlaid or dual inlaid interconnect structure, as shown in FIG. 11.

Although the present invention has been described with reference to a specific embodiment, further modifications and improvements will occur to those skilled in the art. It is to be understood therefore, that the invention encompasses all such modifications that do not depart from the spirit and scope of the invention as defined in the appended claims.

What is claimed is:

1. A method for forming a barrier layer on a wafer, the method comprising:

placing the wafer in a processing chamber;

powering a sputtering target for a first time period;

powering a coil for a second time period, wherein the second time period is different from the first time period; and controlling power to both the sputtering target and to the coil during a deposition of the barrier layer, wherein powering the sputtering target occurs before powering the coil and a first portion of the barrier layer formed during a time between powering the sputtering target and powering the coil is less tensile than a second portion of the barrier layer formed during a time after powering the sputtering target and powering the coil.

2. The method of claim 1, further comprising powering the wafer during the deposition of the barrier layer.

3. The method of claim 1, further comprising alternately applying power and reducing power to the coil during the deposition of the barrier layer.

4. The method of claim 1, wherein a first amount of an inert sputtering gas incorporated into the barrier layer before powering the coil and a second amount of inert sputtering gas incorporated into the barrier layer after powering the coil are different.

5. The method of claim 4, wherein the inert sputtering gas includes argon.

6. The method of claim 1, wherein material is sputtered from both the coil and the sputtering target to form the barrier layer.

* * * * *